(12) United States Patent
Briat

(10) Patent No.: US 12,332,721 B2
(45) Date of Patent: Jun. 17, 2025

(54) POWER SUPPLY CONTROL METHOD

(71) Applicant: STMicroelectronics (Grenoble 2) SAS, Grenoble (FR)

(72) Inventor: Gerald Briat, Vif (FR)

(73) Assignee: STMicroelectronics (Grenoble 2) SAS, Grenoble (FR)

( * ) Notice: Subject to any disclaimer, the term of this patent is extended or adjusted under 35 U.S.C. 154(b) by 190 days.

(21) Appl. No.: 18/084,669

(22) Filed: Dec. 20, 2022

(65) Prior Publication Data

US 2023/0129599 A1  Apr. 27, 2023

Related U.S. Application Data

(63) Continuation of application No. 17/111,877, filed on Dec. 4, 2020, now Pat. No. 11,567,558.

(30) Foreign Application Priority Data

Dec. 5, 2019 (FR) ........................................ 1913805

(51) Int. Cl.
  *G06F 1/3234* (2019.01)
  *G06F 3/06* (2006.01)
  *G11C 16/30* (2006.01)

(52) U.S. Cl.
  CPC .......... *G06F 1/3275* (2013.01); *G06F 1/3243* (2013.01); *G06F 3/0625* (2013.01); *G06F 3/0659* (2013.01); *G06F 3/0679* (2013.01); *G11C 16/30* (2013.01)

(58) Field of Classification Search
  CPC .... G06F 1/3275; G06F 1/3243; G06F 3/0625; G06F 3/0659; G06F 3/0679; G11C 16/30
  See application file for complete search history.

(56) References Cited

U.S. PATENT DOCUMENTS

| | | | |
|---|---|---|---|
| 5,859,444 A | 1/1999 | Okada et al. | |
| 6,249,837 B1* | 6/2001 | Tsuchiya | G06F 1/3203 |
| | | | 711/170 |
| 7,617,407 B2 | 11/2009 | Adamo et al. | |
| 9,977,732 B1 | 5/2018 | Keeler et al. | |
| 11,079,936 B2* | 8/2021 | Chang | G06F 3/0673 |
| 11,347,297 B1* | 5/2022 | Ko | G06N 3/063 |
| 2007/0260867 A1 | 11/2007 | Ethier et al. | |
| 2010/0106886 A1 | 4/2010 | Marcu et al. | |
| 2013/0031397 A1* | 1/2013 | Abe | G06F 1/3225 |
| | | | 713/324 |
| 2015/0067361 A1 | 3/2015 | Rusu et al. | |

(Continued)

FOREIGN PATENT DOCUMENTS

EP  2843561 A1  3/2015

OTHER PUBLICATIONS

INPI Search Report and Written Opinion for FR Appl. No. 1913805 dated Jul. 32, 2020 (8 pages).

*Primary Examiner* — Aurel Prifti
(74) *Attorney, Agent, or Firm* — Crowe & Dunlevy LLC

(57) ABSTRACT

A memory chip includes at least two memory blocks. In a method for controlling power supply for the memory blocks of the memory chip, each memory block receives a command for switching to standby mode. The commands are issued, for example by a processor, separately for each memory block in order to be able to individually place the memory block in standby mode.

17 Claims, 4 Drawing Sheets

(56) References Cited

U.S. PATENT DOCUMENTS

| | | | |
|---|---|---|---|
| 2016/0055031 A1* | 2/2016 | Tu .......................... | G06F 9/441 |
| | | | 718/108 |
| 2017/0102754 A1* | 4/2017 | Chi .......................... | G06F 1/10 |
| 2017/0185139 A1 | 6/2017 | Zwerg et al. | |
| 2017/0371396 A1* | 12/2017 | Balasubramanian ....................... | |
| | | | G06F 1/3243 |
| 2018/0067539 A1* | 3/2018 | Samson ................ | G06F 1/3275 |
| 2018/0107417 A1 | 4/2018 | Shechter et al. | |
| 2018/0373450 A1 | 12/2018 | Ji et al. | |
| 2019/0079573 A1* | 3/2019 | Hanson ................ | G06F 1/3275 |
| 2019/0102110 A1 | 4/2019 | Shaharabany et al. | |
| 2019/0265909 A1 | 8/2019 | Frolikov | |
| 2020/0101207 A1 | 4/2020 | Weston et al. | |
| 2020/0379778 A1* | 12/2020 | Blodgett ................ | G06F 3/0679 |
| 2020/0401207 A1* | 12/2020 | Yang ....................... | G11C 16/30 |
| 2021/0064119 A1* | 3/2021 | Mirichigni .......... | G11C 11/2297 |
| 2021/0089404 A1 | 3/2021 | Jabori et al. | |
| 2022/0108755 A1* | 4/2022 | Hartz ..................... | G11C 16/10 |
| 2022/0350535 A1* | 11/2022 | Song ..................... | G06F 1/3275 |

\* cited by examiner

POWER SUPPLY CONTROL METHOD

CROSS REFERENCE TO RELATED APPLICATIONS

This application is a continuation of U.S. patent application Ser. No. 17/111,877, filed Dec. 4, 2020, which claims the priority benefit of French Application for Patent No. 1913805, filed on Dec. 5, 2019, the contents of which are hereby incorporated by reference in their entireties to the maximum extent allowable by law.

TECHNICAL FIELD

The present disclosure relates generally to electronic circuits, and more specifically to microcontrollers.

BACKGROUND

A microcontroller generally includes a processor making it possible to execute a program. This processor is often associated with a memory, for example a flash memory, also belonging to the microcontroller. The flash memory in particular makes it possible to store the program executed by the processor and to record variables used during this execution.

The current microcontrollers are primarily configured to equip embedded systems having limited energy sources. In order for these embedded systems to benefit from maximal autonomy, an effort is in particular made to develop microcontrollers that are still more energy-efficient.

There is a need to reduce the energy consumption of microcontrollers.

There is a need to address all or some of the drawbacks of known power supply control methods of microcontrollers.

SUMMARY

An embodiment provides a power supply control method of a memory chip including at least two memory blocks, in which each memory block receives a standby mode command separate from that of the other memory block, so as to be switched to standby mode individually.

According to one embodiment, each memory block receives an access request separate from that other memory blocks, so as to be taken out of standby mode individually.

According to one embodiment, a processor is configured to send each memory block: the standby command; and the access request.

According to one embodiment, the memory chip and the processor are part of a same microcontroller.

According to one embodiment, a delay with a duration greater than 5 µs is introduced between receiving the access request and the exit from standby mode of the memory block in question.

According to one embodiment, a non-volatile memory, separate from the memory blocks, stores data representative of the standby command of each memory block.

According to one embodiment, the data representative of the standby mode command of each memory block are stored in a register.

According to one embodiment, the memory chip includes exactly two memory blocks each corresponding to a different physical region inside the memory chip.

According to one embodiment, each memory block of the memory chip is powered under a voltage equal to about 3.3 V.

According to one embodiment, each memory block consumes, in standby mode, an electric current with an intensity equal to about 0.1 µA.

According to one embodiment, each memory block consumes, outside standby mode, an electric current with an intensity about five hundred times greater than in standby mode.

According to one embodiment, the memory chip is a flash memory chip.

According to one embodiment, each memory block is associated with a finite state machine.

One embodiment provides a finite state machine configured to implement the described method.

One embodiment provides a circuit comprising at least one memory chip configured to implement the described method.

BRIEF DESCRIPTION OF THE DRAWINGS

The foregoing features and advantages, as well as others, will be described in detail in the following description of specific embodiments given by way of illustration and not limitation with reference to the accompanying drawings, in which.

DETAILED DESCRIPTION

Like features have been designated by like references in the various figures. In particular, the structural and/or functional features that are common among the various embodiments may have the same references and may dispose identical structural, dimensional and material properties.

For the sake of clarity, only the operations and elements that are useful for an understanding of the embodiments described herein have been illustrated and described in detail. In particular, the data that may be written, read and erased by the processor in the flash memory are not described in detail.

Unless indicated otherwise, when reference is made to two elements connected together, this signifies a direct connection without any intermediate elements other than conductors, and when reference is made to two elements coupled together, this signifies that these two elements can be connected or they can be coupled via one or more other elements.

In the following disclosure, unless indicated otherwise, when reference is made to absolute positional qualifiers, such as the terms "front", "back", "top", "bottom", "left", "right", etc., or to relative positional qualifiers, such as the terms "above", "below", "higher", "lower", etc., or to qualifiers of orientation, such as "horizontal", "vertical", etc., reference is made to the orientation shown in the figures.

Unless specified otherwise, the expressions "around", "approximately", "substantially" and "in the order of" signify within 10%, and preferably within 5%.

Figure 1:
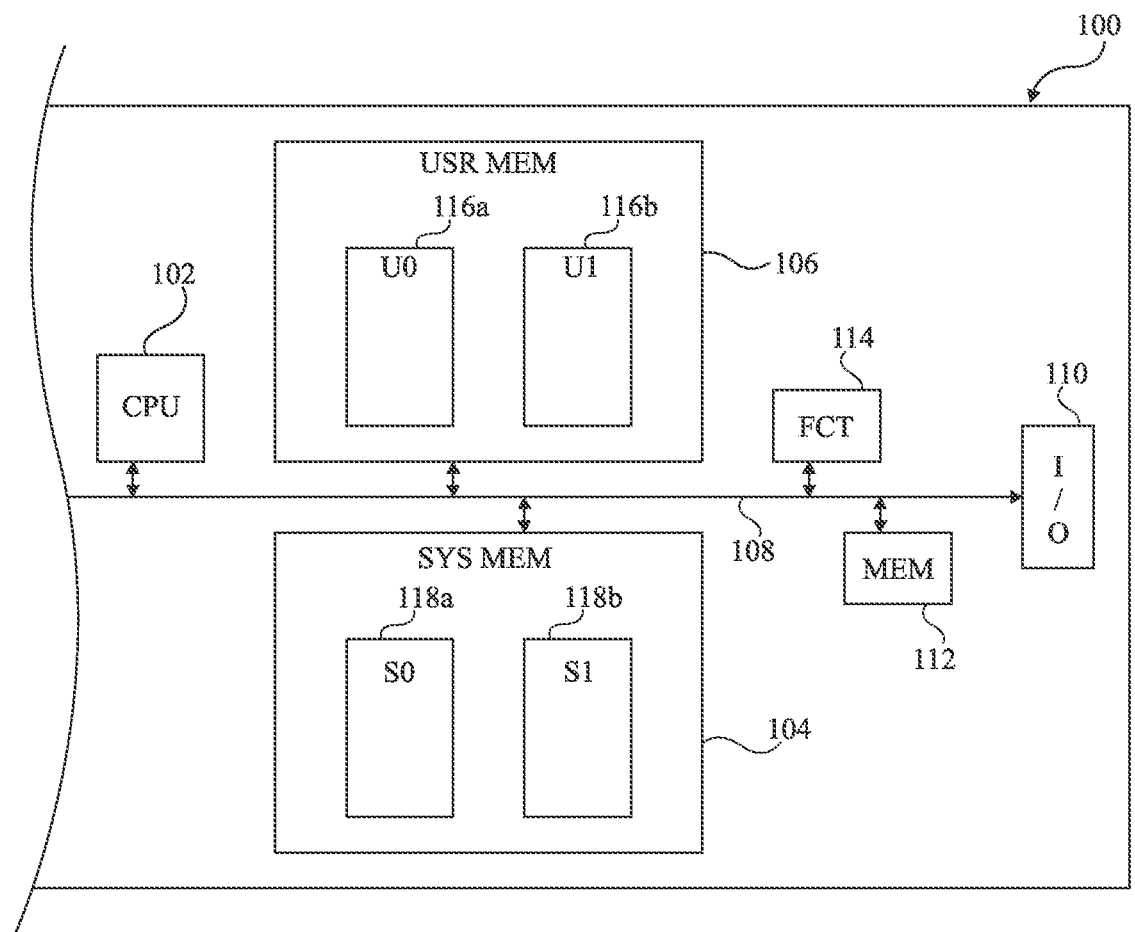
FIG. 1 shows, schematically and in block form, an exemplary microcontroller of the type to which, as an example, the described embodiments apply.

FIG. 1 shows, schematically and in block form, an exemplary microcontroller 100 of the type to which, as an example, the described embodiments apply.

In FIG. 1, the microcontroller 100 includes a processing unit 102 (CPU). The processing unit 102 is, for example, a processor configured to execute code instructions of a computer program.

The microcontroller 100 further includes a flash memory chip 104 (SYS MEM), also called system memory 104 in the remainder of the disclosure. In general, the system memory 104 is primarily used to store data related to the intrinsic operation of the microcontroller 100. These data typically allow the microcontroller 100 to operate independently of the selected application. As an example, the system memory 104 in particular contains data associated with a "watchdog" making it possible to control the execution duration, by the processor 102, of the code instructions of the computer program.

The microcontroller 100 includes another flash memory chip 106 (USR MEM), also called user memory 106 in the remainder of the disclosure. In general, the user memory 106 is primarily used to store data specific to the selected application. As an example, the memory 106 contains the code instructions of the computer program executed by the processor 102 as well as constants related to this execution.

The system memory 104 has a content that is generally factory-set, for example by the manufacturer of the microcontroller 100. The user memory 106 conversely has a content that is often configured later, specifically to suit each application in which the microcontroller 100 is used.

The flash memory chip 106 may include a plurality of memory blocks 116, or memory banks 116. In the example illustrated in FIG. 1, the user memory 106 of the microcontroller 100 includes two memory blocks 116a (U0) and 116b (U1). Similarly, the flash memory chip 104 may include a plurality of memory blocks 118, or memory banks 118. In the example illustrated in FIG. 1, the system memory 104 of the microcontroller 100 includes two memory blocks 118a (S0) and 118b (S1).

In practice, each memory block 116, 118 physically corresponds to a separate sub-entity or hardware region inside the flash memory chip 106, 104 to which it belongs.

In the example of FIG. 1, the microcontroller 100 also includes: one or several data, addresses and/or control buses 108 between the different elements inside the microcontroller 100; an input/output interface 110 (I/O) for communication with the outside of the microcontroller 100; and one or several other volatile and/or non-volatile storage memories, symbolized in FIG. 1 by a block 112 (MEM), for example a random-access memory (RAM), making it possible to store dynamic variables related to the execution of the program by the processor 102.

As a function of the targeted application, the microcontroller 100 may also include various other functional circuits. In FIG. 1, these circuits are symbolized by a single block 114 (FCT).

As an example, the processing unit 102, the system memory 104, the user memory 106, the input/output interface 110, the other memories 112 and the other circuits 114 are made on a single substrate and form an architecture of the "system-on-chip" (SoC) type.

In applications where the microcontroller 100 is configured for use in a device including a limited energy source, for example an embedded system, an effort is generally made to ensure that the microcontroller 100 has the lowest energy consumption possible. In order to decrease the energy consumption of the microcontroller 100, it is possible to consider putting one or several elements of the microcontroller 100 in standby mode, for example when these elements are not in use.

It is in particular possible to consider putting the user memory 106 of the microcontroller 100 in standby mode during periods of inactivity of this user memory 106. Such periods of inactivity of the user memory 106 may, in particular, occur when the processor 102 of the microcontroller 100 does not need to access them.

In most applications, the processor 102, however, frequently needs to access the user memory 106 in order to write, read or erase its content. The execution of a program by the processor 102, in particular, causes repeated access to the user memory 106, for example to read instructions and/or constants therein. Each access requested by the processor 102 to the user memory 106 causes an exit from standby mode of the user memory 106. This results in the fact that putting the user memory 106 in standby mode generally does not allow to achieve significant energy savings.

Figure 2:
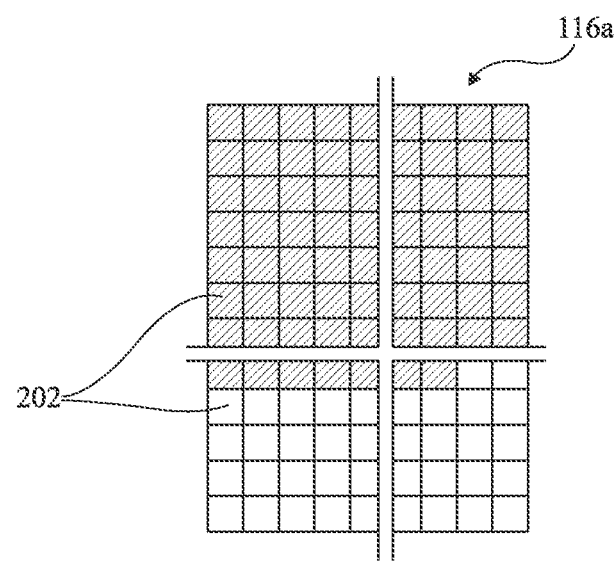
FIG. 2 shows, schematically, an exemplary memory block of the type to which, as an example, the described embodiments apply.

FIG. 2 shows, schematically, an exemplary memory block 116a of the type to which, as an example, the described embodiments apply.

The memory block 116a of the flash memory chip 106 includes, as illustrated in FIG. 2, a matrix of memory points 202. These memory points 202, or memory cells 202, are organized in rows and columns of the matrix of memory cells 202. For the sake of clarity, only several memory cells 202 have been shown in FIG. 2 provided that, in practice, the memory block 116a may include any number of memory cells 202, for example several thousand or several million memory cells 202.

Each memory cell 202 of the memory block 116a stores a bit whose value corresponds to a logic state among two possible logic states, for example denoted "0" and "1". Inside the memory block 116a, several memory cells 202 may be grouped together. In particular, several memory cells 202, for example 137 adjacent memory cells 202, may be grouped together in order to form a word with 137 bits. Each word with 137 bits is, for example, made up of 128 data bits and 9 bits forming an error correction code (ECC).

Inside the memory block 116a of the user memory 106, the rows of the matrix of memory cells 202, for example, each include 8 words of 137 bits each. Furthermore, still inside the memory block 116a, several rows may be grouped together. In particular, several rows of the memory block 116a, for example 512 consecutive rows, may be grouped together in order to form a page of the memory block 116a.

The memory block 116a of the flash memory chip 106 of the microcontroller 100, for example, has a total capacity of 1 MB (one megabyte).

The other memory blocks of the microcontroller 100, in other words the memory block 116b of the flash memory chip 106 and the memory blocks 118a and 118b of the flash memory chip 104, may have a structure similar to that of the memory block 116a as disclosed above.

In FIG. 2, a crosshatched box arbitrarily symbolizes a memory cell 202 used to store an information item, for example a program fragment executed by the processor 102 of the microcontroller 100, and a non-crosshatched box symbolizes a memory cell 202 not used to store an information item.

The memory cells 202 that are used to store an information item each contain a bit whose value corresponds to one or the other of the binary states 0 and 1, this value being able to vary from one memory cell 202 to the other. The memory cells 202 that are not used to store an information item are generally all placed in the same binary state, for example 1.

As shown in FIG. 2, the information items are, for example, stored inside the memory block 116a in adjacent memory cells 202. In the orientation of FIG. 2, the memory cells 202 located in the upper part of the memory block 116a are used to store one or several pieces of information, while the memory cells 202 located in the lower part of the memory block 116a do not store information. In other words, the memory block 116a includes, in its lower part, a free area not allocated to information storage.

Figure 3:
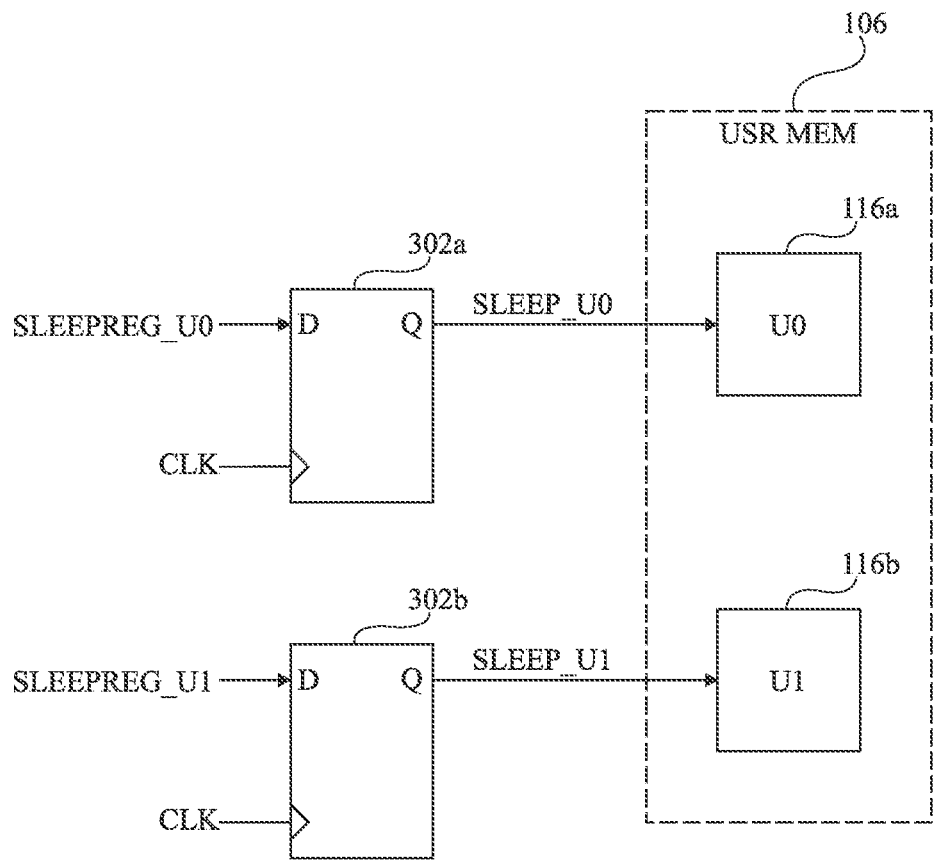
FIG. 3 illustrates, schematically, a step of one embodiment of a power supply control method of a flash memory chip.

FIG. 3 illustrates, schematically, a step of one embodiment of a power supply control method of a flash memory chip.

According to this embodiment, the memory blocks 116a (U0) and 116b (U1) of the flash memory chip 106 (USR MEM) are individually switched to standby mode as a function of a standby mode command signal. More specifically, as illustrated in FIG. 3: a signal, denoted SLEEP_U0, commands the switching to standby mode of the memory block 116a of the memory 106; and another signal, denoted SLEEP_U1, commands the switching to standby mode of the memory block 116b of the memory 106.

According to one embodiment, the flash memory chip 106 (FIG. 1) includes a connecting pad (not shown) to which is coupled, preferably connected, a link conveying the signals SLEEP_U0 and SLEEP_U1 controlling the switching to standby mode of the memory blocks 116a and 116b, respectively. In a variant, each signal SLEEP_U0, SLEEP_U1 is physically transmitted to the flash memory chip 106 by means of a link separate from that allowing to send the other signal, each link being coupled, preferably connected, to a dedicated connecting pad of the flash memory chip 106.

In other words, the signal SLEEP_U0 commands the switching of the memory block 116a to standby mode independently of the state, in standby mode or outside standby mode, of the memory block 116b. Similarly, the signal SLEEP_U1 commands the switching of the memory block 116b to standby mode of operation independently of the state, in standby mode or outside standby mode, of the memory block 116a.

According to one embodiment, a latch 302a, the output (Q) of which is coupled to the flash memory chip 106, supplies the signal SLEEP_U0 controlling the switching to standby mode of the memory block 116a. The latch 302a receives, as illustrated in FIG. 3: a signal SLEEPREG_U0, on a data input (D); and a synchronization signal CLK, or clock signal, on a synchronization input (>).

Similarly, a latch 302b, the output (Q) of which is coupled to the flash memory chip 106, supplies the signal SLEEP_U1 controlling the switching to standby mode of the memory block 116b. The latch 302b receives, as illustrated in FIG. 3: a signal SLEEPREG_U1, on a data input (D); and the synchronization signal CLK, or clock signal, on a synchronization input (>).

According to one embodiment, the signals SLEEP-REG_U0 and SLEEPREG_U1 are sent to the latches 302a and 302b asynchronously, for example at the initiative of the processor 102 of the microcontroller 100 of FIG. 1. The latches 302a and 302b then allow to synchronize the signals SLEEPREG_U0 and SLEEPREG_U1 with respect to the clock signal CLK.

According to one embodiment, data allowing to command the state of each signal SLEEPREG_U0, SLEEPREG_U1 are stored in a register, for example a state register. This state register is preferably stored in the system memory 104, for example in the block 108a (FIG. 1) of the system memory 104.

One advantage of the embodiment disclosed in relation with FIG. 3 lies in the fact that the memory blocks 116a and 116b may be put in standby mode individually. In applications where the information items to be stored in the user memory 106 do not exceed the capacity of a single memory block 116a, 116b, it is then possible to store all of the information in a same memory block, for example the memory block 116a. This makes it possible to leave the other memory block free, the memory block 116b in this example. The memory block 116b may then advantageously be switched to standby mode independently of the memory block 116a. The switching of the memory block 116b to standby mode in particular allows to reduce the energy consumption of the memory block 116b, and advantageously the energy consumption of the flash memory chip 106 and the microcontroller 100.

In other words, one takes advantage of the fact that the memory blocks 116a, 116b may be put in standby mode individually to reduce the energy consumption of an unused memory block.

Each memory block is preferably powered under a voltage equal to about 3.3 V, for example a direct polarization (DC) voltage equal to 3.3 V. In this case, each memory block 116a, 116b of the flash memory chip 106 for example consumes: in standby mode, an electric current with an intensity equal to about 0.1 µA; and outside standby mode, an electric current with an intensity equal to about 50 µA.

More generally, each memory block 116a, 116b of the flash memory chip 106 consumes, outside standby mode, an electric current with an intensity about five hundred times greater than the intensity consumed by this same memory block 116a, 116b in standby mode. In other words, each memory block 116a, 116b of the flash memory chip 106 consumes, in standby mode, an electric current with an intensity about five hundred times lower than the intensity consumed by this same memory block 116a, 116b outside standby mode.

Figure 4:
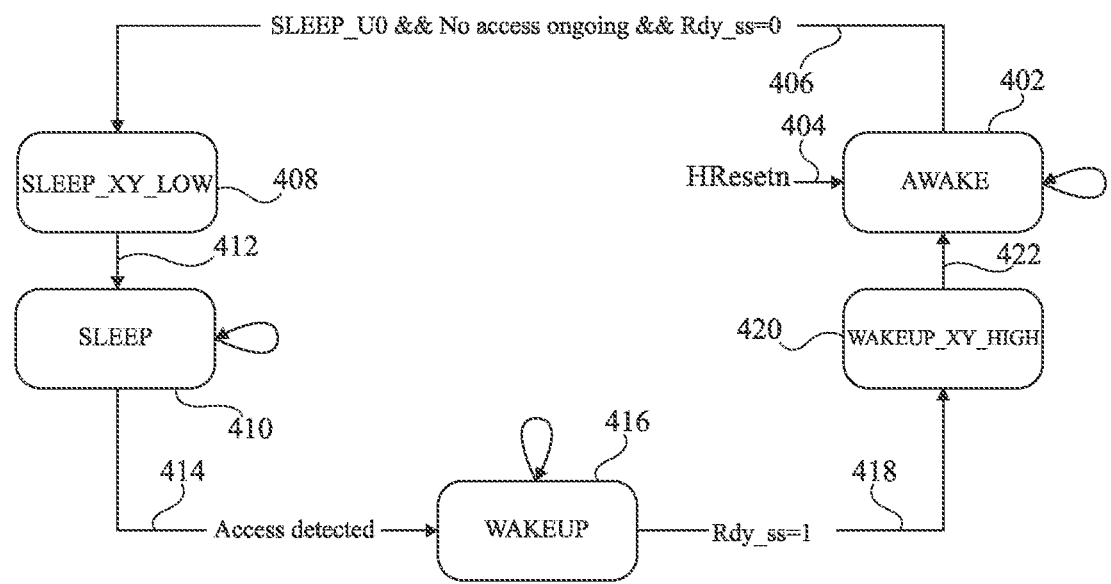
FIG. 4 illustrates, in the form of a flowchart, one embodiment of a power supply control method of a microcontroller.

FIG. 4 illustrates, in the form of a flowchart, one embodiment of a power supply control method of a microcontroller.

The embodiment disclosed in relation with FIG. 4 more specifically allows a control of the power supply of one or several memory blocks of a same flash memory chip, for example the memory block 116a of the flash memory chip 106 of the microcontroller 100 (FIG. 1). However, what is disclosed below in relation with an exemplary power supply control of the memory block 116a is, in particular, transposable by one skilled in the art to a power supply control of the memory block 116b of the chip 106 and memory blocks 118a and 118b of the chip 104.

It is arbitrarily considered that the block 116a of the flash memory chip 106 is initially found in a state (block 402, AWAKE) outside standby mode. In the remainder of the disclosure, the state 402 is described as active mode, as opposed to standby mode.

According to one embodiment, the memory block 116a is in the state 402 by default. This state, for example, corresponds to an initial configuration of the microcontroller 100 upon leaving the factory or after receipt, by the processor 102 and/or the flash memory chip 106, of a reset command (arrow 404, HResetn).

In the case where the latch 302a (FIG. 3) controls the switching of the memory block 116a to standby mode, where no memory access is in progress in the memory block 116a and where an exit from standby mode is not requested, the memory block 116a then transitions (arrow 406, SLEEP_U0 && No access ongoing && Rdy_ss=0) to another state (block 408, SLEEP_XY_LOW).

The state 408, for example, corresponds to an intermediate or transitional state between the active mode 402 and still another state (block 410, SLEEP). The state 408 is preferably maintained during a single clock cycle before the switching (arrow 412) to the state 410.

The state 410 preferably corresponds to the standby mode of the memory block 116a. In the standby mode 410, the energy consumption of the memory block 116a, in other words, the electrical power consumed by the memory block 116a, is reduced with respect to the active mode 402.

When it is in standby mode 410, the memory block 116a may receive an access request. This access request automatically causes the switching (arrow 414, Access detected) from the standby mode 410 of the memory block 116a to still another state (block 416, WAKEUP).

From the state 416, a signal, denoted Rdy_ss, to leave the standby mode is sent to the memory block 116a following the access request. According to one preferred embodiment, a delay with a duration greater than 5 us is introduced between receiving the access request and the sending of the signal Rdy_ss to exit the standby mode 410 of the memory block 116a.

The signal Rdy_ss is preferably a binary signal, one state of which corresponds to a request to enter standby mode and the other state of which corresponds to a request to exit standby mode. A state change of the signal Rdy_ss therefore occurs, in a length of time greater than 5 μs, upon each request to access the memory block 116a.

According to one preferred embodiment, the exit from the standby mode 410 of the memory block 116a is caused by: an access request in read mode in the memory block 116a; an access request in write mode in the memory block 116a; or an erase request in the memory block 116a, with the exception of a simultaneous erase request of the two memory blocks 116a and 116b of the flash memory chip 106.

Still according to this preferred embodiment, the memory blocks 116a and 116b of the flash memory chip 106 are both taken out of standby mode in case of: a simultaneous erase request of the two memory blocks 116a and 116b of the flash memory chip 106; a request for successive write and erase operations; or a launch request, denoted OBL_LAUNCH, allowing to read a configuration of the microcontroller 100 from the flash memory chip 104.

According to one embodiment, the validity of the access requests listed above is verified before sending them to the memory block(s) in question. This advantageously makes it possible to avoid taking a memory block out of standby mode in a case where the request to access this memory block is erroneous.

From the state 416, the state change of the signal Rdy_ss causes the switching (arrow 418, Rdy_ss=1) from the state 416 to still another state (block 420, WAKEUP_XY_HIGH). The state 420, for example, corresponds to an intermediate or transitional state between the active mode 416 and still another state (block 402, SLEEP). The state 420 is preferably maintained during a single clock cycle before the switching (arrow 422) to the active state 402.

According to one embodiment, the switching to the active state 402 of the memory block 116a causes a state change of the signal Rdy_ss.

One advantage of the embodiment of the power supply control method disclosed above in relation with FIG. 4 lies in the fact that this method is compatible with the existing flash memories that include at least two memory blocks. Indeed, a request to access a memory block is enough to cause it to leave standby mode. No software program is in particular used to manage the exit from standby mode of each memory block.

According to one embodiment, the two memory blocks 116a and 116b of the flash memory chip 106 of the microcontroller 100 (FIG. 1) are in active mode 402 after reset of the microcontroller 100. In an application where one wishes to load, in the flash memory chip 106, a program with a size not exceeding the content of a single memory block 116a, 116b, this program is loaded in one of the two memory blocks, for example the memory block 116a. The memory block 116b is then assumed to be empty and unused. It is therefore possible to put the memory block 116b in standby mode.

In case of update of the program stored in the memory block 116a, it is possible to transfer a new version of this program into the memory block 116b of the flash memory chip 106. The memory block 116b is then taken out of standby mode in order for data corresponding to the new version of the program to be written in the memory block 116b. It is then possible to put the memory block 116a containing the old version of the program in standby mode and to execute the new version of the program from the memory block 116b.

This advantageously makes it possible not to delete an old version of a program when loading a new version of a program. One therefore retains a possibility of reverting to the old version of the program, for example in case of problem during the transfer or execution of the new version of the program, which in particular makes it possible to keep a functional microcontroller 100 at the end of a failed update procedure.

Figure 5:
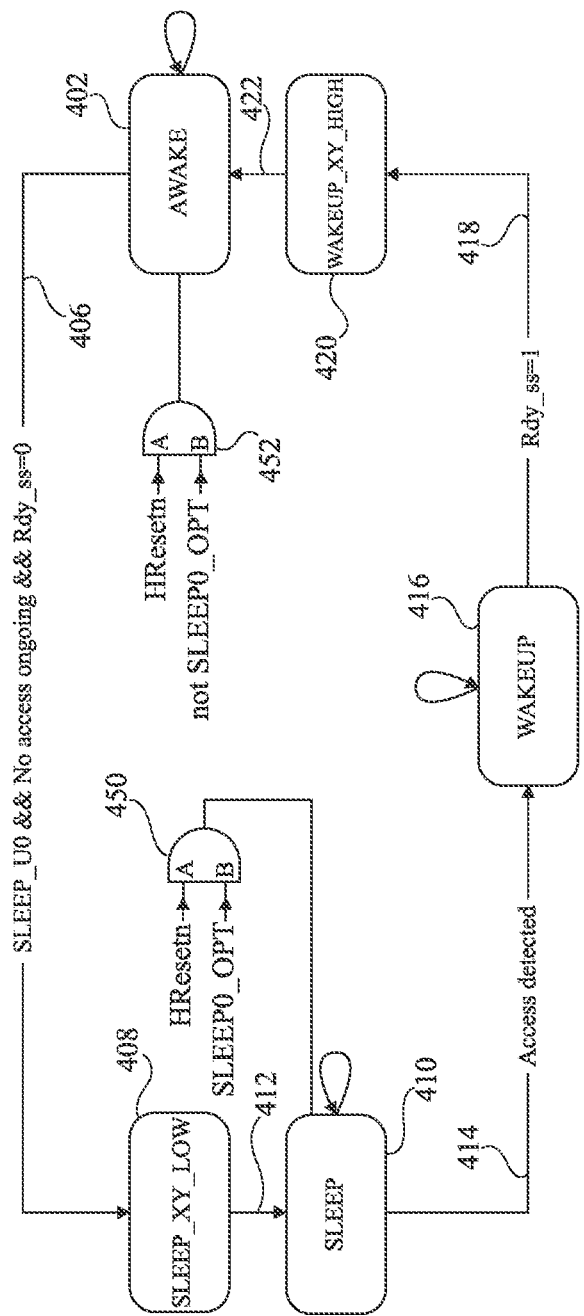
FIG. 5 illustrates, in the form of a flowchart, another embodiment of a power supply control method of a microcontroller.

FIG. 5 illustrates, in the form of a flowchart, another embodiment of a power supply control method of a microcontroller.

The embodiment of FIG. 5 comprises steps and transitions shared with the embodiment of FIG. 4. These shared steps and transitions will not be disclosed again below.

In the embodiment of FIG. 5, a nonvolatile memory (not shown), separate from the memory blocks 116a and 116b of the flash memory chip 106, stores data representative of the commands SLEEP_U0 and SLEEP_U1 to put the memory blocks 116a and 116b, respectively, in standby mode. These data are preferably each stored in the form of a bit in a register of one of the memory blocks 118a, 118b of the memory chip 104 (FIG. 1).

In a case where one wishes to keep the memory block 116a in standby mode, the storage of the bit representative of the command SLEEP_U0 to put the memory block 116a in standby mode ensures that the memory block 116a is switched directly to standby mode after a reset. The bit representative of the command SLEEP_U0 is preferably equal to: a value, for example 1, in case of command to put the memory block 116a in standby mode; and another value, for example 0, in case of command to take the memory block 116a out of standby mode.

In the remainder of the disclosure, SLEEP0_OPT denotes a binary signal, the state of which is a function of the value of the bit representative of the command SLEEP_U0. It is arbitrarily considered that the signal SLEEP0_OPT is in the high state when the bit representative of the command SLEEP_U0 is equal to 1, and in the low state when the bit representative of the command SLEEP_U0 is equal to 0.

In FIG. 5, an AND logic gate 450, making it possible to put the memory block 116a in standby mode 410, receives: on an input (A), the reset signal (HResetn); and on another input (B), the signal SLEEP0_OPT.

Another AND logic gate 452, allowing to put the memory block 116a in active mode 402, receives: on an input (A), the reset signal (HResetn); and on another input (B), the inverse (not SLEEP0_OPT) of the signal SLEEP0_OPT.

It is assumed that the signal Hresetn is in the high state in case of reset. Upon each reset, the AND logic gate 450 thus allows to put the memory block 116a directly in standby mode 410 if the signal SLEEP0_OPT is in the high state. Otherwise, if the signal SLEEP0_OPT is in the low state, the memory block 116a is switched to the active mode 402 by the logic gate 452. In other words, the signal SLEEP0_OPT allows to ensure that, after a reset, the memory block 116a is by default directly put either in standby mode 410, or in active mode 402.

The embodiment of the method disclosed above in relation with FIG. 5 allows to further reduce the energy consumption of the microcontroller 100, in particular with respect to a situation where the memory blocks 116a and 116b of the memory chip 106 are by default taken out of standby mode upon each reset of the processor 102 of the microcontroller 100.

The methods disclosed above in relation with FIGS. 4 and 5 are preferably implemented by a finite state machine. Similarly, other finite state machines implementing similar methods may be provided in order to command the switching of the memory blocks 116b, 118a and 118b of the microcontroller 100 of FIG. 1 to standby mode. If applicable, one preferably has one finite state machine per memory block 116a, 116b, 118a, 118b.

Figure 6:
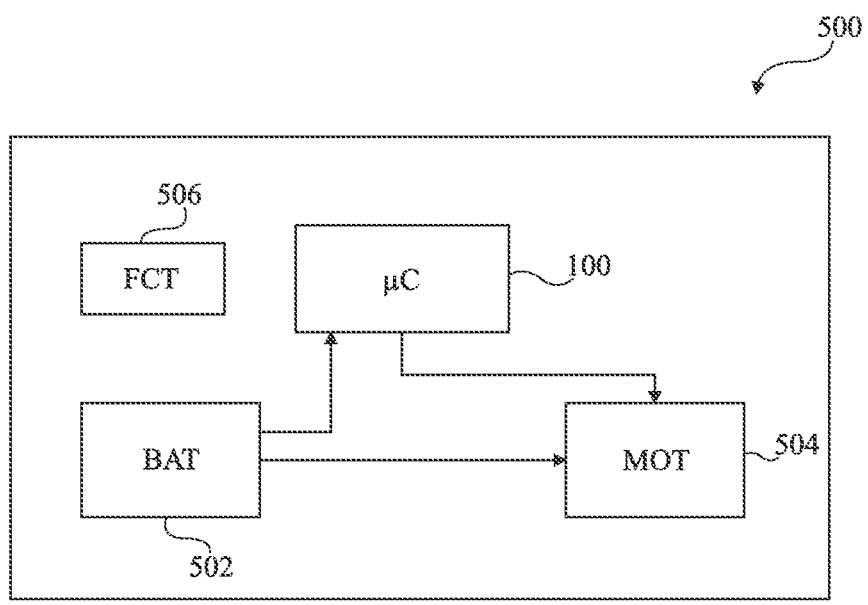
FIG. 6 shows, very schematically and in block form, an exemplary embedded system.

FIG. 6 shows, very schematically and in block form, an exemplary embedded system 500. The embedded system 500 is for example a drone.

The drone 500 includes an energy source (block 502, BAT), for example a battery. The battery 502 in particular powers one or several motors, shown in FIG. 6 by a block 504 (MOT).

The battery 502 also powers the microcontroller 100 (µC), for example by means of an energy converter (not shown in FIG. 6). The microcontroller 100 is in particular used as a flight controller of the drone 500, that is to say, the microcontroller 100 is configured to command the motors 504 of the drone 500.

The drone 500 may also include various other functional elements. In FIG. 6, these elements are symbolized by a block 506 (FCT).

The power supply control methods disclosed above in relation with FIGS. 4 and 5 in particular allow to optimize the energy consumption of the microcontroller 100. The battery 502 is thus discharged at a slower speed with respect to a case where the disclosed power supply control methods are not implemented. One thus obtains a drone 500 having an improved autonomy.

Various embodiments have been described. Those skilled in the art will understand that certain features of these embodiments may be combined and other variants will readily occur to those skilled in the art. In particular, what is more specifically described in relation with an exemplary application to a flash memory chip more generally applies to any type of memory.

Finally, the practical implementation of the embodiments and variants described herein is within the capabilities of those skilled in the art based on the functional description provided hereinabove. In particular, the management of the states of the different signals and the generation of the signal Rdy_ss are within the capabilities of those skilled in the art from the above description.

The invention claimed is:

1. A circuit, comprising:
   a first memory chip including a first memory block and a second memory block;
   wherein each of the first and second memory blocks is operable in a standby mode and an active mode;
   a second memory chip separate from the first memory chip and including a state register configured to store a first mode control command signal for specifying standby or active mode for operation of the first memory block and further configured to store a second mode control command signal for specifying standby or active mode for operation of the second memory block;
   a first latch having an input configured to receive the first mode control command signal, a clock input configured to receive a clock signal, and an output coupled to a mode control input of the first memory block;
   a second latch having an input configured to receive the second mode control command signal, a clock input configured to receive said clock signal, and an output coupled to a mode control input of the second memory block; and
   a processing circuit configured to generate said first and second mode control command signals for loading into the first and second registers, respectively.

2. The circuit of claim 1, wherein a first logic state of the first mode control command signal commands operation of the first memory block in standby mode and a second logic state of the first mode control command signal commands operation of the first memory block in active mode.

3. The circuit of claim 1, wherein a first logic state of the second mode control command signal commands operation of the second memory block in standby mode and a second logic state of the second mode control command signal commands operation of the second memory block in active mode.

4. The circuit of claim 1, wherein the processing circuit asynchronously generates said first and second mode control command signals, and wherein assertion of the clock signal synchronizes the first and second mode control command signals.

5. The circuit of claim 1, further comprising:
   a logic circuit configured to logically combine the output of the first latch with a reset signal to generate a control signal coupled to the mode control input of the first memory block;
   wherein said reset signal is asserted in response to a circuit reset, and said asserted reset signal, when logically combined with the output of the first latch, commands operation of the first memory block in sleep mode.

6. The circuit of claim 1, further comprising:
   a logic circuit configured to logically combine the output of the second latch with a reset signal to generate a control signal coupled to the mode control input of the second memory block;

wherein said reset signal is asserted in response to a circuit reset, and said asserted reset signal, when logically combined with the output of the second latch, commands operation of the second memory block in sleep mode.

7. The circuit of claim 1, further comprising:
a logic circuit configured to logically combine the output of the first latch with a reset signal to generate a control signal coupled to the mode control input of the first memory block;
wherein said reset signal is asserted in response to a circuit reset, and said asserted reset signal, when logically combined with the output of the first latch, commands operation of the first memory block in active mode.

8. The circuit of claim 1, further comprising:
a logic circuit configured to logically combine the output of the second latch with a reset signal to generate a control signal coupled to the mode control input of the second memory block;
wherein said reset signal is asserted in response to a circuit reset, and said asserted reset signal, when logically combined with the output of the second latch, commands operation of the second memory block in active mode.

9. A circuit, comprising:
a memory chip including at least two memory blocks;
a non-volatile memory separate from the at least two memory blocks that is configured to store a mode command for each memory block, wherein said mode command indicates whether the memory block is to be in one of a standby mode and an active mode; and
a logic circuit that operates in response to an assertion of a reset signal to:
logic AND the mode command for each memory block from the non-volatile memory to each memory block with said reset signal in order to configure the memory block to be in the standby mode when the mode command has a first logic value and configure the memory block to be in the active mode when the mode command has a second logic value.

10. The circuit according to claim 9, wherein the non-volatile memory comprises a register that is separate from the memory blocks.

11. The circuit according to claim 9, wherein the memory chip includes exactly two memory blocks each corresponding to a different physical region inside the memory chip.

12. The circuit according to claim 9, wherein each memory block of the memory chip is powered by a voltage equal to about 3.3 V.

13. The circuit according to claim 9, wherein each memory block consumes, in standby mode, an electric current with an intensity equal to about 0.1 µA.

14. The circuit according to claim 13, wherein each memory block consumes, in active mode, an electric current with an intensity about five hundred times greater than in standby mode.

15. The circuit according to claim 9, wherein the memory chip is a flash memory chip.

16. The circuit according to claim 9, wherein the reset signal is generated in response to reset of a processor.

17. The circuit according to claim 16, wherein the memory chip and the processor are part of a microcontroller.

* * * * *